United States Patent
Lee et al.

[11] Patent Number: 5,964,030
[45] Date of Patent: Oct. 12, 1999

[54] MOLD FLOW REGULATING DAM RING

[75] Inventors: Sang S. Lee, Sunnyvale; William M. Loh, Fremont, both of Calif.

[73] Assignee: VLSI Technology, Inc., San Jose, Calif.

[21] Appl. No.: 09/028,087

[22] Filed: Feb. 23, 1998

Related U.S. Application Data

[60] Continuation of application No. 08/543,984, Oct. 17, 1995, abandoned, which is a division of application No. 08/257,969, Jun. 10, 1994, abandoned.

[51] Int. Cl.⁶ .................................................. H01R 43/00
[52] U.S. Cl. ................... 29/827; 264/272.17; 264/328.12
[58] Field of Search ............................. 29/827, 855, 856, 29/874, 884, 832; 264/272.17, 328.17

[56] References Cited

U.S. PATENT DOCUMENTS

| | | | |
|---|---|---|---|
| 5,096,853 | 3/1992 | Yasunaga et al. | 29/827 |
| 5,197,183 | 3/1993 | Chia et al. | 29/827 |
| 5,406,699 | 4/1995 | Oyama | 29/827 |
| 5,577,319 | 11/1996 | Knecht | 29/827 |
| 5,692,296 | 12/1997 | Variot | 29/827 |
| 5,724,726 | 3/1998 | Tomita et al. | 29/827 |

OTHER PUBLICATIONS

Research Disclosure Dec. 1992, No. 34439 Moldless IC Package.

*Primary Examiner*—Carl J. Arbes
*Attorney, Agent, or Firm*—Patrick T. King

[57] ABSTRACT

An apparatus and method for balancing the flow of molten molding compound above and below an integrated circuit assembly during encapsulation of the assembly. An annular shaped layer of material is placed over the bonding fingers of a leadframe such that the annular shaped layer of material peripherally surrounds the centrally located opening in the leadframe. The annular shaped layer of material has sufficient width and thickness to slow the flow of molten molding material over the top surface of the integrated circuit assembly to the same speed as the flow of molten material under the bottom surface of the integrated circuit package assembly. In so doing, the present invention reduces the formation of blowholes or voids in encapsulated integrated circuit packages.

16 Claims, 3 Drawing Sheets

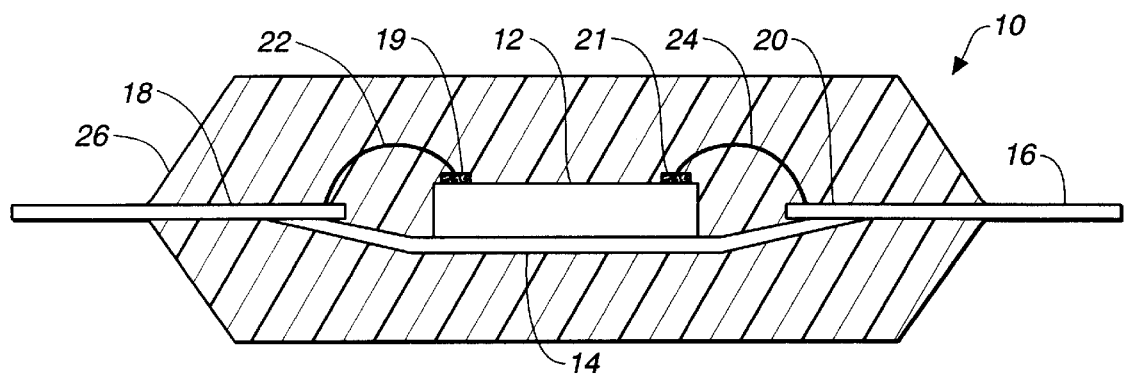
FIG._1
(PRIOR ART)
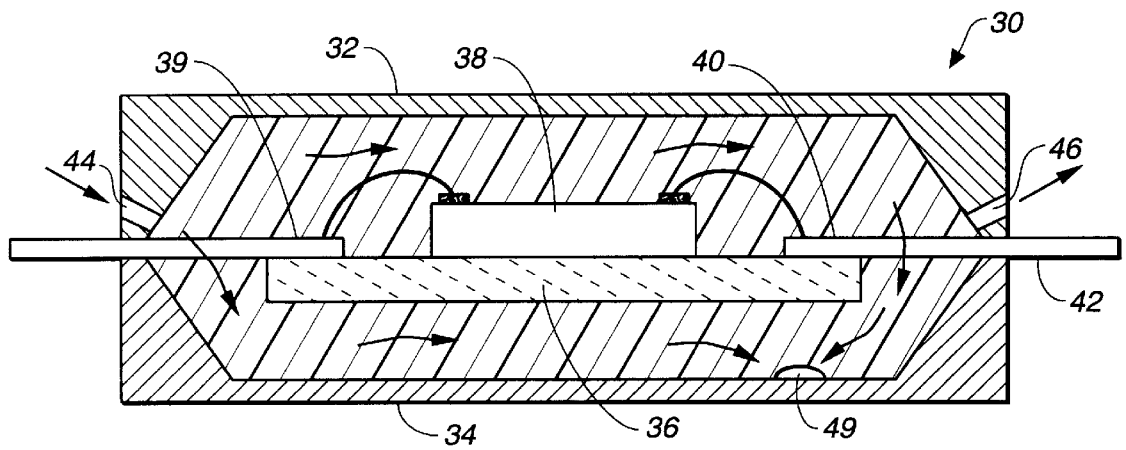
FIG._2
(PRIOR ART)
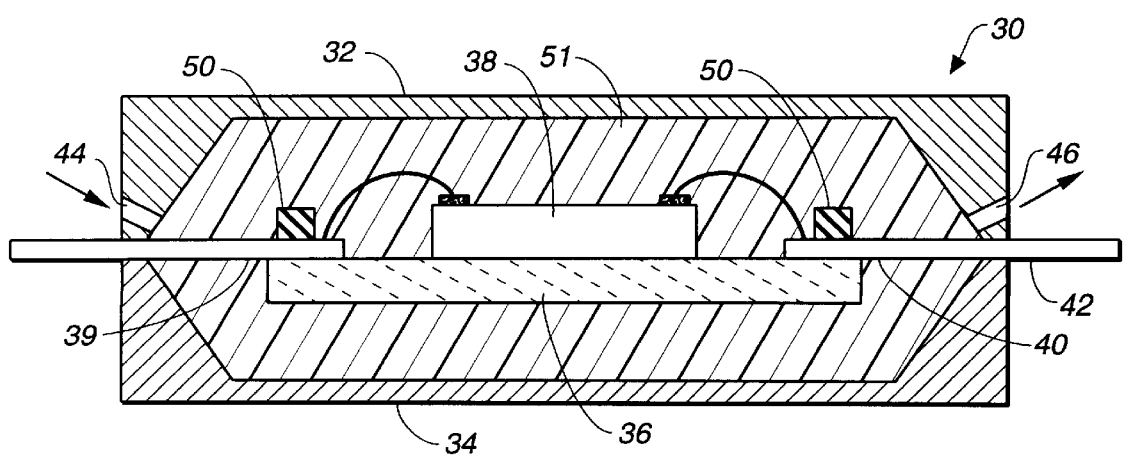
FIG._3

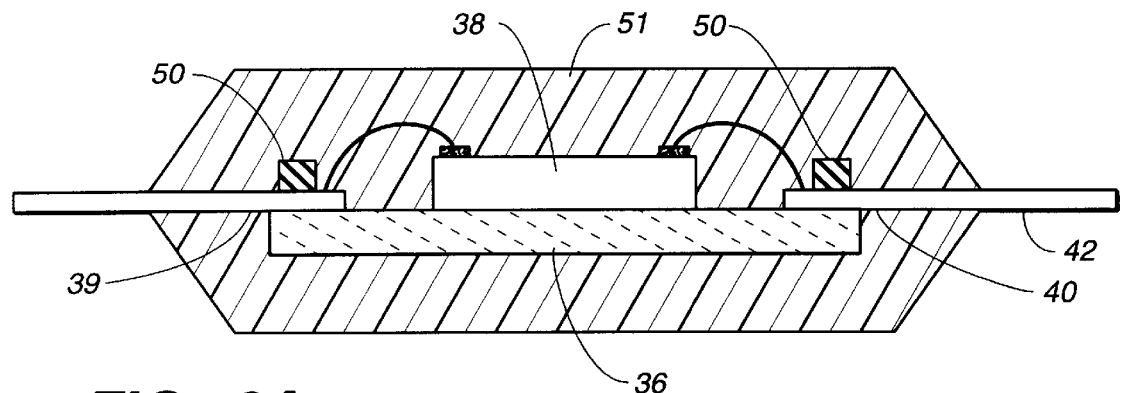
FIG._3A
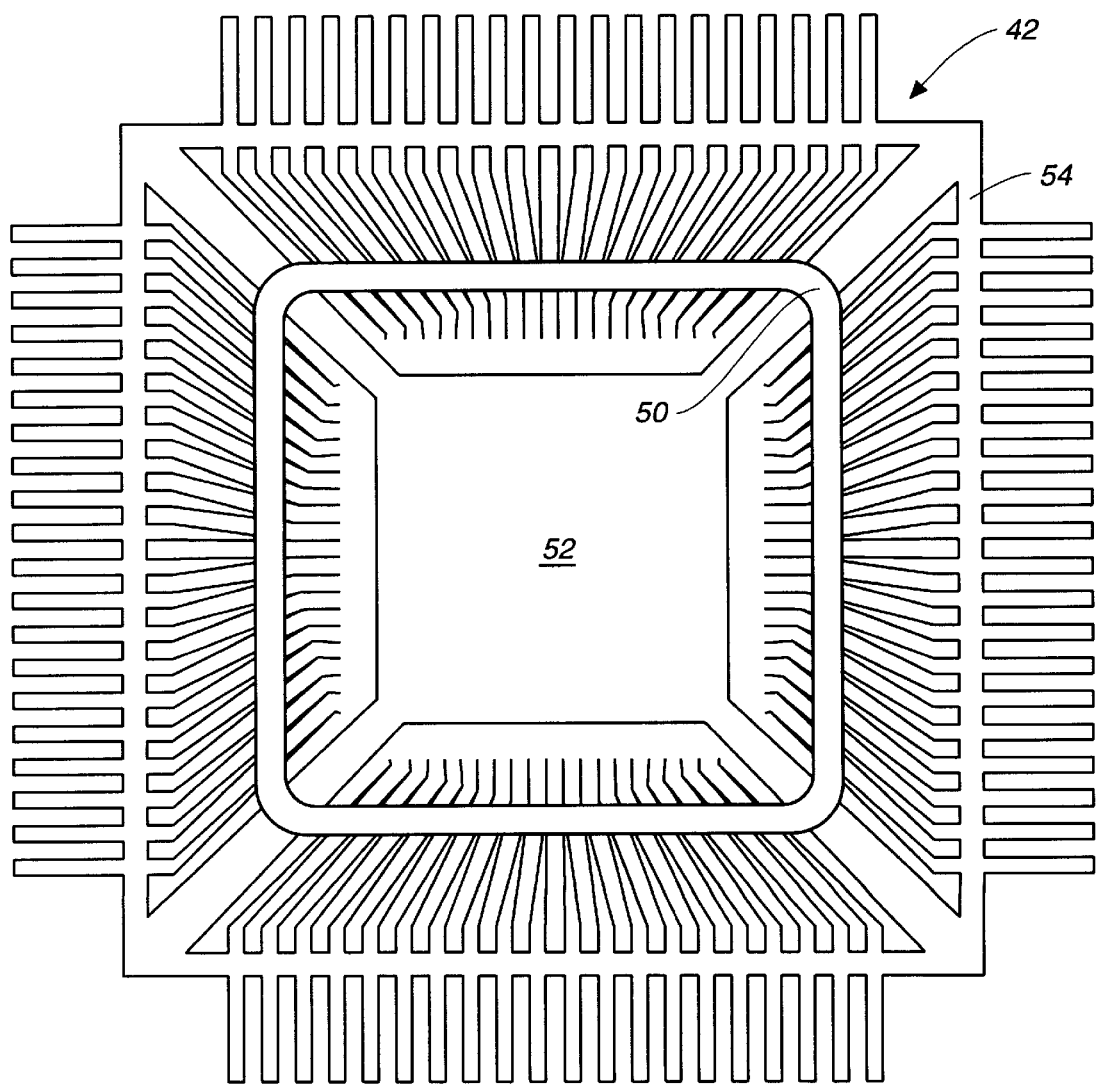
FIG._4

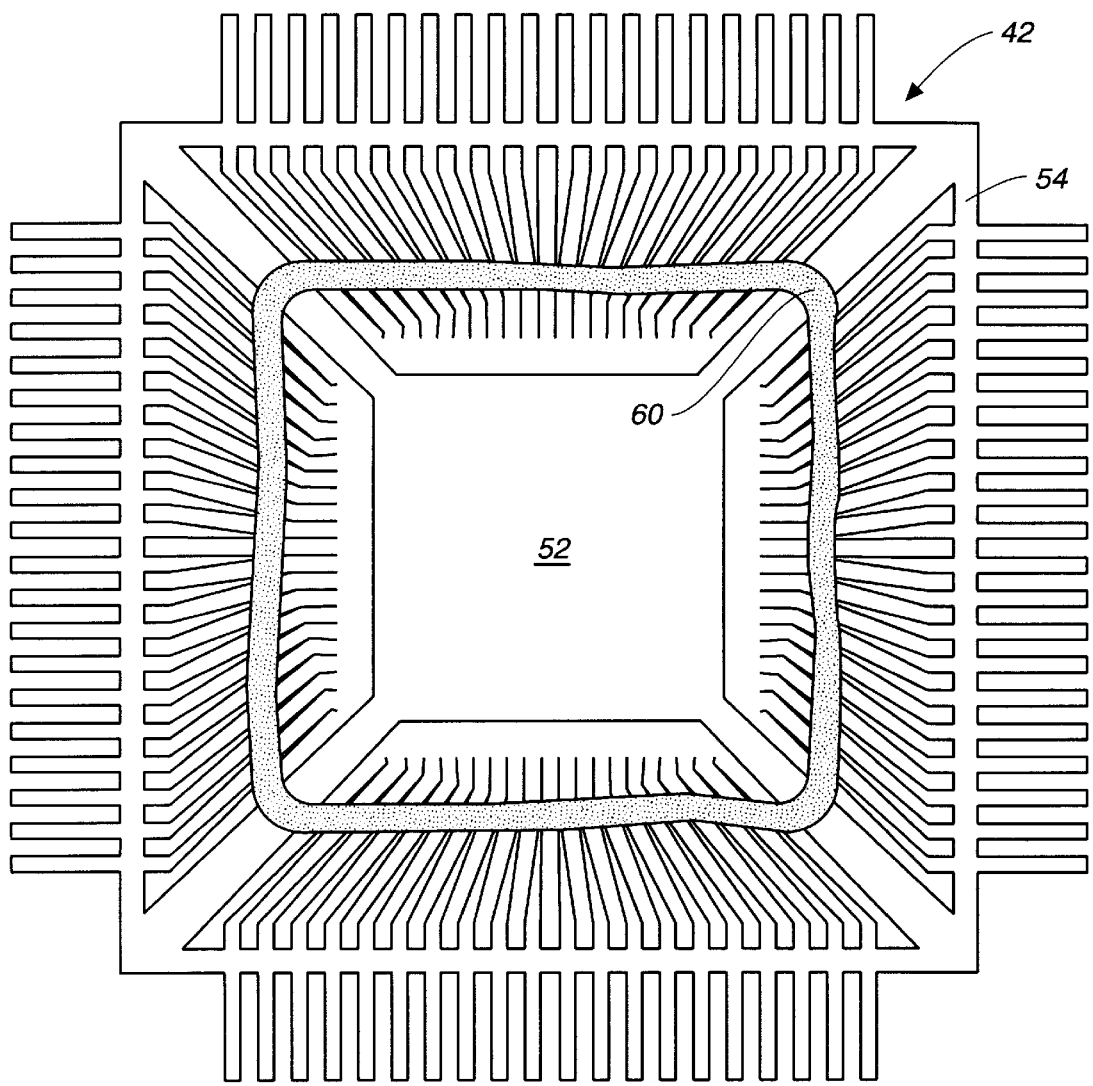
FIG._5
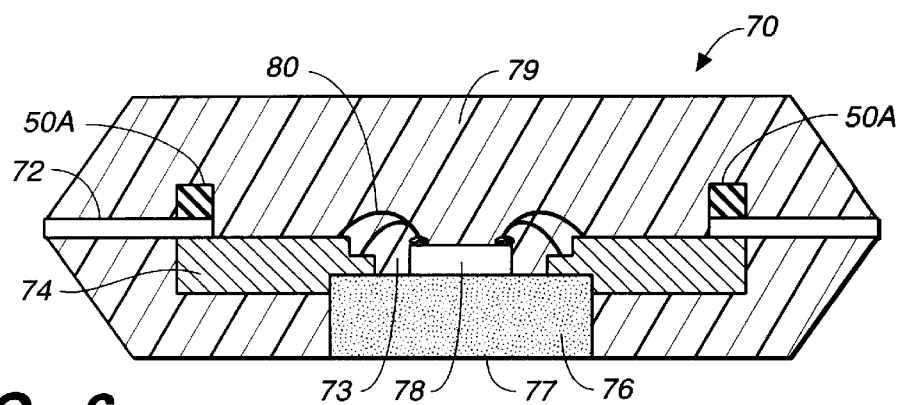
FIG._6

MOLD FLOW REGULATING DAM RING

This application is a continuation application of application Ser. No. 08/543,984 filed Oct. 17, 1995, now abandoned, which is a divisional of patent Ser. No. 08/257,969 filed Jun. 10, 1994, now abandoned.

BACKGROUND OF THE INVENTION

1. Field of the Invention

The present claimed invention relates to the field of encapsulated integrated circuit packages. More specifically, the present claimed invention relates to the reduction of blowholes or voids in molten plastic encapsulated integrated circuit packages which contain bulky heat sinks.

2. Prior Art

In an attempt to remove heat from an integrated circuit die in an integrated circuit package assembly, the integrated circuit die is often placed onto the top surface of a thermally conductive heat sink. Most thermally conductive heat sinks such as, for example, copper or ceramic slugs are extremely bulky. As a result of the bulky size of the heat sink, when the integrated circuit package assembly is inserted into a mold cavity the heat sink occupies a large area in the bottom half of the mold cavity. Thus, when molten mold compound is introduced into the mold cavity, the flow of the molten mold compound in the lower half of the mold cavity is restricted and therefore slowed.

Because the flow of molten material is slowed in the bottom half of the mold cavity, the faster flowing molten mold material in the top half of the mold cavity is able to flow over the top surface of the integrated circuit package assembly before the molten mold compound is able to flow under the mold cavity. As a result, the molten mold material in the top half of the mold cavity reaches and blocks air vents in the mold cavity. Therefore, air under the integrated circuit package assembly is unable to be exhausted through the vent hole and becomes trapped under the integrated circuit package assembly. The trapped air leads to the formation of blowholes or voids in the body of the molded package surrounding the integrated circuit package assembly.

Attempts have been made to alleviate the formation of blowholes or voids. These attempts include forming holes through the die attach paddle of the leadframe and or through the heat sink in order to balance the flow of molten mold material over and under the integrated circuit package assembly. However, these methods require substantial additional machining of the leadframe and the heat sink and dramatically raise the cost of the encapsulated integrated circuit package assembly.

Consequently, a need exists for an integrated circuit package assembly which does not create voids on the body of an encapsulated package, which does not require substantial machining of the heat sink, and which does not dramatically increase the cost of the encapsulated integrated circuit package assembly.

SUMMARY OF THE INVENTION

It is therefore an object of the present invention to provide an integrated circuit package assembly which does not create voids on the body of an encapsulated package, which does not require substantial machining of the heat sink, and which does not dramatically increase the cost of the encapsulated integrated circuit package assembly. The above object has been achieved with a low cost annular shaped layer of material placed over the bonding fingers of a leadframe such that the annular shaped layer of material peripherally surrounds the centrally located opening in the leadframe. The annular shaped layer of material has sufficient width and thickness to slow the flow of molten molding material over the top surface of the integrated circuit assembly to approximately the same speed as the flow of molten material under the bottom surface of the integrated circuit package assembly.

In one embodiment, the annular shaped layer of material is a ring of epoxy material which is dispensed onto the bonding fingers of a leadframe in an annular pattern. The ring of epoxy peripherally surrounds the centrally located opening in the leadframe.

In another embodiment, the annular shaped layer of material is a ring formed of PC board type material. The PC board ring is bonded to the bonding fingers of the leadframe such that the PC board ring peripherally surrounds the centrally located opening in the leadframe.

In so doing, the present invention reduces the formation of blowholes or voids in encapsulated integrated circuit packages.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a side cut-away view of a Prior Art quad flat package assembly for an integrated-circuit die.

FIG. 2 is a side cut-away view of a Prior Art integrated circuit package assembly with a bulky thermally conductive substrate attached thereto wherein the package assembly is located within a mold cavity.

FIG. 3 is a side cut-away view of an integrated circuit package assembly having a bulky thermally conductive substrate attached thereto wherein an annular shaped layer of material is positioned over the bonding fingers of the leadframe of the integrated circuit package assembly located in a mold cavity in accordance with the present claimed invention.

FIG. 3A is a side cut-away view of an integrated circuit package assembly having a bulky thermally conductive substrate attached thereto wherein an annular shaped layer of material is positioned over the bonding fingers of the leadframe of the integrated circuit package assembly in accordance with the present claimed invention.

FIG. 4 is a top view of a PC board ring attached to the bonding fingers of a leadframe in accordance with the present claimed invention.

FIG. 5 is a top view of another embodiment of the invention of FIG. 4, showing a ring of epoxy which has been dispensed over the bonding fingers of a leadframe in accordance with the present claimed invention.

FIG. 6 is a cut-away side view of an alternate encapsulated integrated circuit package assembly having an annular layer of material disposed thereon in accordance with the present claimed invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

With reference now to Prior Art FIG. 1, a conventional quad flat package assembly 10 for an integrated-circuit die 12 is shown. The integrated-circuit die 12 is attached to an upset die-attach paddle portion 14, which is at the center region of a conventional lead frame 16. The ends of various inwardly-extending bonding fingers (typically shown as 18 and 20) are connected to respective bonding pads (typically shown as 19 and 21) on the integrated-circuit die 12 using respective bonding wires 22 and 24, as indicated in Prior Art FIG. 1. The entire assembly described above is encapsulated in a molded plastic material, which forms a molded-plastic body 26 for the package.

With reference next to Prior Art FIG. 2 a package mold 30, which has a top half 32 and a bottom half 34, for molding an integrated circuit package assembly with a bulky thermally conductive substrate 36 attached thereto is shown. Bulky thermally conductive substrate 36, is formed of a material such as, for example, copper, and has an integrated-circuit die 38 electrically insulated from and mounted thereto. Bulky thermally conductive substrate 36 replaces a conventional die attach paddle and improves the thermal performance of a molded-plastic package. Bonding fingers (typically shown as 39 and 40) of a lead frame 42 are attached to the outer margins of bulky thermally conductive substrate 36. As in the case of a conventional quad flat package (QFP) assembly, the bulky thermally conductive substrate 36 with its attached integrated-circuit die 38 are placed in the cavity formed between the two halves 32 and 34 of the mold 30. Molten plastic mold material is injected into the top half of the mold at the inlet gate 44. The molten plastic material enters the top half 32 of the mold and flows through the spaces between the bonding fingers of lead frame 42 into the bottom half of the mold cavity. Air present within the mold cavity is expelled through air vents (typically shown as 46) located at the corners of mold 30.

With reference still to Prior Art FIG. 2, the arrows indicate the flow of plastic molding material through the top half of the mold and the bottom half of the mold. Note that bulky thermally conductive substrate 36 is much larger than a conventional die-attach paddle, such as shown in Prior Art FIG. 1. The use of bulky thermally conductive substrate 36 unbalances the flow of molten plastic molding material in several ways. One way is that the flow cross-sectional area in the lower space of the cavity is smaller. This results in the flow of the molten molding material in the upper half of the mold being greater than the flow of the molten molding material in the lower half of the mold. As a result of the differences in flow, molten plastic molding material in the upper half of the mold cavity reaches the air vent 46 before the molten plastic molding material in the bottom half of the mold cavity reaches air vent 46. As a result, air in the bottom half of the mold cavity is unable to be expelled or exhausted through vent hole 46 and becomes trapped within the bottom half of the mold cavity. The trapped air creates voids, also called blow holes or pinholes, in the body of the package. A typical void 49 is shown in FIG. 2.

With reference next to FIGS. 3 and 3A, a cut-away side view of one embodiment of the present invention is shown. In the embodiment of FIG. 3, an annular shaped layer of material 50 is positioned over the bonding fingers (typically shown as 39 and 40) of a leadframe 42 in an integrated circuit package assembly having a bulky thermally conductive substrate 36 attached thereto. In the present embodiment, annular layer of material 50 is comprised of an inexpensive rectangular ring formed of PC board material. Rectangular ring 50 of PC board material is bonded to the bonding finger 39 and 40 of leadframe 42, such that PC board rectangular ring 50 peripherally surrounds the central opening in leadframe 42 in which a die-attach paddle may be located. In the present embodiment, PC board rectangular ring 50 is bonded to leadframe 42 using any of the numerous, suitable adhesives which are known in the art. Although ring 50 is rectangular in the present embodiment, the present invention is also well suited to the use of numerous other shapes such as, for example, poly-sided or circular rings. Furthermore, although rectangular ring 50 is formed of PC board in the present embodiment, the present invention is well suited to the use of a ring formed of different material. The entire assembly is therefore encapsulated in a molded plastic material, which forms a molded-plastic body 51 for the package.

With reference next to FIG. 4, a top view of leadframe 42 with PC board rectangular ring 50 attached thereto is shown. In FIG. 4, PC board rectangular ring 50 has a diameter such that it is positioned approximately midway between the outer edge of die-attach paddle 52 and dambar 54. However, the present claimed invention is also well suited to a PC board rectangular ring 50 having a smaller diameter, such that PC board rectangular ring 50 is positioned over the ends of the bonding fingers proximate to the edge of die attach paddle 52 in the central opening of leadframe 42. Likewise, the present invention is also well suited to a PC board rectangular ring 50 having a larger diameter such that PC board rectangular ring 50 is positioned over the bonding fingers proximate to the dambar 54 of leadframe 42.

With reference again to FIG. 4, PC board rectangular ring 50 may be formed by several methods. For example, PC board ring 50 may be stamped from a single piece of PC board, or laser etched from a PC board etc.

With reference again to FIG. 3, PC board rectangular ring 50 has a sufficient thickness and width to slow the flow of molding compound over the top surface of the integrated circuit package assembly. That is, PC board rectangular ring 50 is of sufficient size to restrict the flow of molten mold compound over the top of the integrated circuit package assembly to approximately the same speed as the flow of molten mold compound under the integrated circuit package assembly. Therefore, even though the integrated circuit package assembly contains a bulky thermally conductive substrate 36, the present invention provides for a balanced flow of molten mold material both over and under the integrated circuit package assembly. By producing such a balanced flow, the present invention reduces the formation of blowholes and voids in the body of an encapsulated integrated circuit package assembly.

With reference still to FIG. 3, in the present embodiment, PC board rectangular ring 50 is formed having a width in the range of approximately 1.7 mm, and a thickness in the range of approximately 0.8 mm. Although such dimensions are used in the present embodiment, the present invention is also well suited to numerous variations in the dimensions of PC board rectangular ring 50. Furthermore, the dimensions of PC board rectangular ring 50 may be adjusted to compensate for differences in the size and consequent mold flow restriction of bulky thermally conductive substrate 36. That is, if the integrated circuit package assembly contains an extremely bulky thermally conductive substrate, such as, for example, an exposed copper slug, the dimensions of PC board rectangular ring 50 are increased. Conversely, if the integrated circuit package assembly contains a substrate which is not extremely bulky, the dimensions of PC board rectangular ring 50 are decreased.

With reference next to FIG. 5, a top view of another embodiment of the present invention is shown. In the embodiment of FIG. 5, an annular ring of material 60 is formed by dispensing epoxy material in a rectangular ring over the bonding fingers of leadframe 42. Rectangular ring of epoxy 60 is dispensed over leadframe 42 such that rectangular ring of epoxy 60 peripherally surrounds die attach paddle 52 of leadframe 42. As in the embodiment of FIG. 4, rectangular ring of epoxy 60 has a diameter such that it is positioned approximately midway between the outer edge of die-attach paddle 52 and dambar 54. However, the present claimed invention is also well suited to dispensing rectangular ring of epoxy 60 over a smaller diameter, such that rectangular ring of epoxy 60 is dispensed over the ends of the bonding fingers proximate to the edge of die attach paddle 52 in the central opening of leadframe 42. Likewise, the present invention is also well suited to dispensing rectangular ring of epoxy 60 over a larger diameter such that rectangular ring of epoxy 60 is dispensed over the bonding fingers proximate to the dambar 54 of leadframe 42.

With reference next to FIG. 6, a cut-away side view of an alternate encapsulated integrated circuit package assembly 70 having an annular layer of material, for example, PC board rectangular ring 50A, disposed thereon is shown. In package assembly 70, a leadframe 72 is coupled to a printed circuit board 74 having a central opening 73 formed therein. Printed circuit board 74 is coupled to a bulky thermally conductive substrate 76 having an integrated circuit die 78 coupled to the top surface thereof. Bulky thermally conductive substrate 76 is of sufficient size such that a bottom surface 77 thereof remains exposed after the encapsulation process. The package assembly, except for the exposed bottom surface of the substrate 76 is encapsulated in a molded plastic material, which forms a molded-plastic body 79 for the package. As mentioned in connection with FIG. 3, the dimensions of the ring 50A are adjusted to compensate for the greater restrictions to flow restrictions around the sides of the substrate 76 while still preventing formation of blowholes and voids. Wire leads, typically shown as 80, electrically connect bonding pads on integrated circuit die 78 to contact regions on the printed circuit board 74. In the present embodiment, a PC board rectangular ring 50, is bonded to the bonding fingers of leadframe 72 near the ends thereof. Thus, the present invention is well suited for use in numerous integrated circuit package assemblies.

In addition to balancing the flow of molten mold material both over and under the leadframe in an integrated circuit package assembly, the present invention provides several substantial benefits. For example, the annular layer of material reinforces the bond between the bonding fingers of the leadframe and the underlying material. The annular layer of material also "stiffens" the integrated circuit package assembly and reduces warpage of the integrated circuit package assembly as the molten mold material hardens. Additionally, by slowing the flow of mold material over the top surface of the leadframe, deleterious wire wash is also reduced. Furthermore, the present invention is easily manufactured from readily available and inexpensive materials.

Thus, the present invention provides an integrated circuit package assembly which does not create voids on the body of an encapsulated package, which does not require substantial machining of the heat sink, and which does not dramatically increase the cost of the encapsulated integrated circuit package assembly.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method of forming an integrated circuit package assembly having a balanced flow of molten molding compound above and below the integrated circuit package assembly during encapsulation of the integrated circuit package assembly, comprising the steps of:

coupling first ends of a plurality of inwardly-extending bonding fingers of a leadframe to a top surface of a thermally conductive substrate, coupling an integrated-circuit die to said upper surface of said substrate such that said integrated-circuit die is disposed within a centrally located opening in said leadframe and such that said plurality of inwardly-extending bonding fingers peripherally surround said integrated-circuit die, placing an annular shaped layer of material over said inwardly-extending bonding fingers of said leadframe such that said annular shaped layer of material peripherally surrounds said centrally located opening in said leadframe;

encapsulating the lead frame, the substrate, the integrated circuit die, and the annular shaped layer of material with a molding compound to form an integrated circuit package while leaving a bottom surface of the thermally conductive substrate unencapsulated; and balancing the flow of molten molding compound above and below the substrate during the encapsulating step using the annular shaped layer of material wherein the annular shaped layer of material has sufficient width and thickness to slow the flow of molten molding material over the top surface of the substrate, to balance the flow of molten material over the top surface of the substrate, and to balance the flow of molten material under the bottom surface of the substrate to reduce the formation of blowholes or voids in the encapsulated integrated circuit package.

2. The method as recited in claim 1 wherein said step of placing an annular shaped layer of material over said inwardly-extending bonding fingers further comprises placing said annular shaped layer of material over said first ends of said inwardly-extending bonding fingers of said leadframe such that said annular shaped layer of material is disposed proximate to the periphery of said centrally located opening in said leadframe.

3. The method as recited in claim 1 wherein said step of placing an annular shaped layer of material over said inwardly-extending bonding fingers further comprises placing a rectangular annular shaped layer of material over said inwardly-extending bonding fingers.

4. The method as recited in claim 1 wherein said step of placing an annular shaped layer of material over said inwardly-extending bonding fingers further comprises disposing a layer of epoxy in an annular pattern over said inwardly-extending bonding fingers of said leadframe.

5. The method as recited in claim 1 wherein said step of placing an annular shaped layer of material over said inwardly-extending bonding fingers further comprises bonding a ring of PC board to said inwardly-extending bonding fingers of said leadframe.

6. A method of forming an integrated circuit package assembly having a balanced flow of molten molding compound through the integrated circuit package assembly during encapsulation of the integrated circuit package assembly, comprising the steps of:

coupling the first ends of a plurality of inwardly-extending bonding fingers of a leadframe to the upper surface of a printed circuit board having a centrally located opening formed therein;

fixing a thermally conductive substrate to a lower surface of the printed circuit board adjacent to the central opening therein;

coupling an integrated-circuit die to an upper surface of said substrate such that said integrated-circuit die is disposed within the centrally located opening in said printed circuit board such that said plurality of inwardly-extending bonding fingers peripherally surround said integrated-circuit die;

placing an annular shaped layer of material over said inwardly-extending bonding fingers such that said annular shaped layer of material peripherally surrounds said centrally located opening in said printed circuit board;

encapsulating the first ends of the bonding fingers, the printed circuit board, the substrate, the integrated circuit die, and the annular shaped layer of material with a molding compound to form an integrated circuit package while leaving a bottom surface of the thermally conductive substrate unencapsulated; and balancing the flow of molten molding compound above the substrate and around the substrate during the encapsulating step using the annular shaped layer of material wherein the annular shaped layer of material has sufficient width and thickness to slow the flow of molten molding material above the substrate to balance the flow of molten material above the substrate with the flow of molten material under the substrate and to reduce the formation of blowholes or voids in encapsulated integrated circuit package.

7. The method as recited in claim 6 wherein said step of placing an annular shaped layer of material over said inwardly-extending bonding fingers further comprises placing said annular shaped layer of material over said first ends of said inwardly-extending bonding fingers of said leadframe such that said annular shaped layer of material peripherally surrounds said integrated-circuit die.

8. The method as recited in claim 6 wherein said step of placing an annular shaped layer of material over said inwardly-extending bonding fingers further comprises placing a rectangular annular shaped layer of material over said inwardly-extending bonding fingers.

9. The method as recited in claim 6 wherein said step of placing an annular shaped layer of material over said inwardly-extending bonding fingers further comprises disposing a layer of epoxy in an annular pattern over said inwardly-extending bonding fingers of said leadframe.

10. The method as recited in claim 6 wherein said step of placing an annular shaped layer of material over said inwardly-extending bonding fingers further comprises bonding a ring of printed circuit board material to said inwardly-extending bonding fingers of said leadframe.

11. A method of forming an integrated circuit package assembly having a balanced flow of molten molding compound through the integrated circuit package assembly during encapsulation of the integrated circuit package assembly, comprising the steps of:

coupling first ends of a plurality of inwardly-extending bonding fingers of a leadframe to the upper surface of a substrate, wherein said substrate includes a heat-conducting portion of said substrate;

coupling an integrated-circuit die to an upper surface of said heat-conducting portion of said substrate such that said integrated-circuit die is disposed within a centrally located opening in said leadframe and such that said plurality of inwardly-extending bonding fingers peripherally surround said integrated-circuit die, placing an annular shaped layer of material over said inwardly-extending bonding fingers of said leadframe such that said annular shaped layer of material peripherally surrounds said centrally located opening in said leadframe;

encapsulating the lead frame, the substrate, the integrated circuit die, and the annular shaped layer of material with a molding compound to form an encapsulated integrated circuit package; and balancing the flow of molten molding compound above and around the substrate, including said heat-conducting portion thereof, during the encapsulating step using the annular shaped layer of material wherein the annular shaped layer of material has sufficient width and thickness to slow the flow of molten molding material over the top surface of the substrate to balance the flow of molten material over the top surface of the substrate and around the substrate to reduce the formation of blowholes or voids in the encapsulated integrated circuit package.

12. The method of claim 11 wherein the substrate is formed entirely of a heat conducting material.

13. The method of claim 11 wherein the step of coupling first ends of a plurality of inwardly-extending bonding fingers of a leadframe to the upper surface of a substrate includes coupling said first ends of the plurality of inwardly-extending bonding finders to a printed-circuit portion of the substrate and coupling the integrated-circuit die to an upper surface of the heat-conducting portion of said substrate, while leaving a lower surface of the heat conducting portion of said substrate unencapsulated.

14. The method as recited in claim 11 wherein said step of placing an annular shaped layer of material over said inwardly-extending bonding fingers further comprises placing a rectangular annular shaped layer of material over said inwardly-extending bonding fingers.

15. The method as recited in claim 11 wherein said step of placing an annular shaped layer of material over said inwardly-extending bonding fingers further comprises disposing a layer of epoxy in an annular pattern over said inwardly-extending bonding fingers of said leadframe.

16. The method as recited in claim 11 wherein said step of placing an annular shaped layer of material over said inwardly-extending bonding fingers further comprises bonding a ring of PC board to said inwardly-extending bonding fingers of said leadframe.

* * * * *